(12) United States Patent
Kruit et al.

(10) Patent No.: US 7,772,564 B2
(45) Date of Patent: Aug. 10, 2010

(54) PARTICLE-OPTICAL APPARATUS EQUIPPED WITH A GAS ION SOURCE

(75) Inventors: Pieter Kruit, Delft (NL); Vipin Nagnath Tondare, Delft (NL)

(73) Assignee: Fei Company, Hillsboro, OR (US)

( * ) Notice: Subject to any disclaimer, the term of this patent is extended or adjusted under 35 U.S.C. 154(b) by 393 days.

(21) Appl. No.: 11/709,303

(22) Filed: Feb. 21, 2007
(Under 37 CFR 1.47)

(65) Prior Publication Data

US 2007/0262263 A1    Nov. 15, 2007

(30) Foreign Application Priority Data

Feb. 22, 2006  (EP) .................................. 06110257

(51) Int. Cl.
*H01J 27/02* (2006.01)
(52) U.S. Cl. ................ 250/427; 250/423 R; 250/492.1; 250/492.2; 250/492.21; 250/492.3
(58) Field of Classification Search .................. 250/421, 250/396 R, 398, 423 R, 427, 492.1, 492.2, 250/492.21, 492.3
See application file for complete search history.

(56) References Cited

U.S. PATENT DOCUMENTS

| | | | | |
|---|---|---|---|---|
| 3,434,894 A | * | 3/1969 | Gale ........................... | 438/514 |
| 4,430,570 A | * | 2/1984 | Takigawa et al. ......... | 250/423 R |
| 4,438,371 A | | 3/1984 | Hosoki et al. | |
| 4,500,787 A | * | 2/1985 | Le Poole et al. ............. | 250/427 |
| 4,503,329 A | * | 3/1985 | Yamaguchi et al. ............. | 850/1 |
| 4,663,559 A | * | 5/1987 | Christensen ................ | 313/336 |
| 4,954,711 A | * | 9/1990 | Fink et al. ............... | 250/423 R |
| 5,041,732 A | * | 8/1991 | Saito et al. ............ | 250/396 ML |
| 5,583,344 A | * | 12/1996 | Mizumura et al. ..... | 250/492.21 |
| 5,587,586 A | * | 12/1996 | Kruit ........................ | 250/423 F |
| 6,040,973 A | * | 3/2000 | Okamoto et al. ............ | 361/235 |

(Continued)

FOREIGN PATENT DOCUMENTS

EP    0056899    8/1982

(Continued)

*Primary Examiner*—Bernard E Souw
*Assistant Examiner*—Michael J Logie
(74) *Attorney, Agent, or Firm*—Scheinberg & Griner, LLP; Michael O. Scheinberg; David Griner

(57) ABSTRACT

The invention relates to an electron impact gas ion with high brightness and low energy spread. This high brightness is achieved by injecting electrons in a small ionization volume (from less than 1 μm to several tens of micrometers in size) from one side and extracting ions from the other. The electrons injected are produced by a high brightness electron source, such as a field emitter or a Schottky emitter.

In one embodiment of the invention the required high electron density in the ionization volume is realized by placing a field emitter close to the ionization volume (e.g. 30 μm), without optics between source and ionization volume.

In another embodiment of the invention the source is imaged onto a MEMS structure. Two small diaphragms of e.g. 50 nm are spaced e.g. 1 μm apart. The electrons enter through one of these diaphragms, while the ions leave the ionization volume through the other one. The two diaphragms are manufactured by e.g. drilling with an ion beam, resulting in two small and well aligned diaphragms.

29 Claims, 4 Drawing Sheets

U.S. PATENT DOCUMENTS

| | | | |
|---|---|---|---|
| 7,002,160 B1 * | 2/2006 | Glass et al. | 250/396 R |
| 7,067,821 B2 * | 6/2006 | Barnard et al. | 250/427 |
| 7,304,299 B2 * | 12/2007 | Perkins | 250/288 |
| 7,609,003 B2 * | 10/2009 | Horsky et al. | 315/111.81 |
| 2006/0011834 A1 * | 1/2006 | Nishimura et al. | 250/310 |
| 2007/0138403 A1 * | 6/2007 | Cubric et al. | 250/396 ML |

FOREIGN PATENT DOCUMENTS

| | | |
|---|---|---|
| JP | 60257048 | 12/1985 |
| JP | 61193348 | 8/1986 |
| JP | 02054851 | 2/1990 |

* cited by examiner

PARTICLE-OPTICAL APPARATUS EQUIPPED WITH A GAS ION SOURCE

TECHNICAL FIELD OF THE INVENTION

The invention relates to a particle-optical apparatus equipped with a gas ion source, which gas ion source comprises a diaphragm wall in which an exit diaphragm with a diameter of at most 20 μm is fitted, an electron source with an electron-emitting surface for generating an electron beam, gas admittance means for admitting a gas at a first side of the diaphragm wall, vacuum means for causing a vacuum—in the form of a lower gas pressure—at the other side of the diaphragm wall, acceleration means for producing an acceleration field accelerating the electron beam to an energy whereby the electrons of this electron beam ionize the gas in an ionization volume, and extraction means for producing an extraction field extracting the produced gas ions from the ionization volume.

The invention also relates to a gas ion source for application in such an apparatus. A gas ion source for such an apparatus is known from U.S. Pat. No. 4,500,787.

BACKGROUND AND SUMMARY OF THE INVENTION

Nowadays, particle-optical apparatus with focused ion beams are, for example, applied in the semiconductor industry for the purpose of processing wafers with focused ion beams. To this end, an ion source is imaged onto the wafer into a so-called ion spot. The processing speed with such ion sources is limited by the ion current density in this ion spot. A high ion current density is achieved by focusing a bright ion source into the ion spot. It is hereby desirable to use ions which do not remain behind in the processed wafers, such as noble gas ions.

The gas ion source described in said US Patent comprises a diaphragm wall, at a first side of which diaphragm wall is located a gas that is to be ionized, at a gas pressure of, for example, 0.2 bar. At the other side of the diaphragm wall is located vacuum, or at least a space with lower gas pressure. In the diaphragm wall, an exit diaphragm is fitted, through which exit diaphragm gas flows out into the vacuum. Electrons generated by an electron source at the vacuum side of the diaphragm wall are accelerated by a first electric field, the acceleration field, and focused by an electron lens, whereby the electron focus is located just before the exit diaphragm on the vacuum side of the diaphragm wall. As a result of collisions between the electrons in the electron focus and the emerging gas atoms, gas ions are now formed in an ionization volume that is thus in the direct vicinity of the exit diaphragm. The volume of the ionization volume is determined by the region in which, concurrently, a high electron density and also a high gas density occur. The ions are extracted from the ionization volume with the aid of a second electric field, the extraction field, and can then be imaged and manipulated with the aid of particle-optical means known per se.

In said US Patent, it is described how a high brightness can be obtained for the gas ion source by keeping the ionization volume small, seeing as the brightness is otherwise limited by plasma and space charge effects. The tiny dimensions of the ionization volume thus desired are achieved as a result of the fact that the exit diaphragm has a cross-section of at most 20 μm. The result of such a small exit diaphragm is that there is only a small volume at the vacuum side of the diaphragm wall where the gas pressure is so high as to result in a sizeable chance of the formation of ions. In addition, according to said US Patent, the electron beam should have a high current density.

A magnitude of the brightness cannot be derived from said US Patent, nor can the energy spread of the produced ions be derived.

Nowadays electron sources, such as sources employing field emitters, Schottky emitters or Carbon Nano Tubes, are often used when there is a need for high brightness electron sources. These sources have small electron-emitting surfaces. As known to the skilled artisan, these sources should be imaged by optics with small aberrations, especially when a relative large current in the image is to be obtained.

However, as ions emerge from the ionization volume, the optics may spatially interfere with the ions emerging from the ionization volume, or the electric fields used in the optics may interfere. As a result the focal length of the imaging optics can not be chosen arbitrarily small. As known to the skilled artisan the combination of a large focal length and small aberrations are conflicting requirements.

The sideways injection of the electrons into the ionization volume, perpendicular to the field extracting the ions from the ionization volume, aggravates the problem of obtaining small aberrations.

It is thus a problem for an ion source as described in said US patent to focus electrons from a high brightness electron source onto the ionization volume while obtaining a high electron current.

In those branches of industry in which workpieces (such as wafers) are processed with focused ion beams, there is a desire for particle-optical apparatus employing gas ion sources with a high brightness and a low energy spread. Only then the geometrical aberrations and the chromatic aberrations caused by imaging optics forming the ion spot can be made small, resulting in the desired small ion spot.

SUMMARY OF INVENTION

The invention aims to provide a particle-optical apparatus of the type described in the opening paragraph, equipped with a gas ion source that can achieve a higher brightness than is currently achievable, at a low energy spread.

To this end, the apparatus according to the invention is characterized in that the electron-emitting surface is located at the gas side of the diaphragm wall, and that the diameter of the electron beam at the location of the ionization volume is less than 30 μm.

The invention is based on the insight that for the ion source to exhibit a high brightness several boundary conditions must be met simultaneously:

- A high electron current density must be available in the ionization volume. This can be achieved using a high brightness electron source, such as a field emission source, a Schottky source or a Carbon Nano Tube (CNT).
- The aberrations of any optics used to focus the electron source onto the ionization volume must be small.
- At the same time any optics used to focus the electron source may not spatially interfere with the emerging ion beam, nor may any electric fields used in these optics interfere with the emerging ion beam.
- Plasma and space charge effects in the ionization volume should be avoided, as these effects limit the brightness. This can be achieved by extracting the ions from the ionization volume by a high electric field over the ionization volume.

Simultaneously the voltage over the ionization volume must be sufficiently small, as this governs the energy spread of the ion source. To combine the high field and the low voltage over the ionization volume, the ionization volume must be small.

As is known to the skilled artisan the desired high electron current density at the ionization volume must be achieved at an electron energy between approximately 50-1000 eV. The ionization efficiency of electron-ion collisions shows a maximum between 50 to 300 eV. Above 300 eV the efficiency rapidly decreases, but at first, until approximately 1 keV, this is compensated by the increase of electron brightness achieved by using higher electron energies. The electrons should therefore have an energy between approximately 50-1000 eV at the ionization volume.

Any interferences, caused by e.g. mechanical displacements/vibrations of the electron-emitting surface, or by magnetic or electric stray fields, must be sufficiently small not to, or hardly to, degrade the spot.

Combining the above mentioned factors two related solutions for this problem appeared to the inventor:

In the first solution focusing optics form an electron spot on the ionization volume. For optimum electron current density in the ionization volume these optics should image the electron-emitting surface of the electron source with such a magnification that the geometric image of the electron-emitting surface has a size comparable to the size of the disk caused by the aberrations of the optics.

This can be explained as follows for a simple optical system consisting of one lens:

The opening angle $\alpha$in accepted by the lens at the source side determines the electron current accepted from the source, to be focused in the electron spot. The angle $\alpha$out at the other side of the lens determines the aberrations, such as spherical aberration. The magnification M from the source to the electron spot equals M=$\alpha$in/$\alpha$out. At given $\alpha$in (thus, at a given current imaged in the electron spot) a large magnification will result in the geometric image being dominant, resulting in a low electron current density. On the other hand, at a small magnification (resulting in a large value for $\alpha$out) the aberrations of the optics are dominant, resulting in a low electron current density. Optimum electron current density occurs when geometric image and aberrations are equally dominant.

Experiments learn that for an optimum electron current density a magnification of e.g. 0.1-10 times should be chosen, resulting in an electron spot of e.g. 5-500 nm.

Obviously smaller aberrations result in a higher optimum electron current density. As known to the skilled artisan a small aberration implies a small distance from the lens to the ionization volume, e.g. 1 mm or less. When the electron source and the optics are placed at the vacuum side of the diaphragm wall, as is done in the prior art ion source, they would hinder the ion beam emerging from the exit diaphragm.

By placing the electron source and the optics at the gas side of the diaphragm wall, they do not obstruct the ions emerging from the exit diaphragm.

In the second solution all the emission of the high brightness electron source should be available in the ionization volume without the use of focusing optics. By placing a high brightness electron source having an electron-emitting surface of small dimensions very close to the ionization volume, it is possible to achieve a high electron density in the gas, without focusing the beam. By placing such an electron-emitting surface at a distance of the order of magnitude of about 10 microns from the ionization volume, the beam diameter at the location of the ionization volume will be no larger than a few microns. In this manner, the total, or almost the total, emission current from the electron-emitting surface is available for ionizations in the ionization volume.

Here as well the electron source must be placed at the gas side of the diaphragm wall, as otherwise the electron source would obstruct the emerging ions.

The linking idea is thus to place a high-brightness electron source on the gas side of the diaphragm wall. This position of the electron source avoids mechanical obstruction of the ions emerging from the exit diaphragm, while enabling a high current density of electrons in the ionization volume.

It deserves mention that an electron source often emits a portion of the electrons in an evenly filled electron beam, but also emits another portion of the electrons from other surface areas and/or distributed across non-usable angular regions (angular distributions). In the description of this invention, the emission of electrons emitted from these other surfaces or with another angular distribution is neglected, even if the total current in these other beams is not negligibly small with respect to the total emitted current.

The acceleration field accelerates the electrons to the energy optimal for ionization, between 50 and 1000 eV. The extraction field extracts the ions formed as a result of ionization out of the ionization volume in a direction opposite to the direction of the electron source. Ions extracted out of the ionization volume can subsequently be further accelerated using particle-optical elements known per se.

In an embodiment of a particle-optical apparatus according to the invention, a second wall is located between the electron-emitting surface and the diaphragm wall, in which second wall a entrance diaphragm is fitted, through which entrance diaphragm the accelerated electrons reach the gas that is to be ionized.

The space in which the electron source is placed can, in the case of this embodiment, be pumped down to vacuum or at least a pressure lower than the pressure of the gas that is to be ionized between the diaphragm wall and the second wall. The electrons accelerated by the acceleration field to an energy of e.g. 50-1000 eV emerge into the gas that is to be ionized via the entrance diaphragm in the second wall, and ionize there the gas atoms in the ionization volume. The extraction field can be caused by a small voltage difference between the diaphragm wall and the second wall, but can also be caused by a field that is applied at the vacuum side of the diaphragm wall and that extends through the exit diaphragm, whereby the diaphragm wall and the second wall are at the same potential.

An advantage of this embodiment is that the electron-emitting surface is located in a space with lower pressure, which simplifies the choice and construction of suitable electron sources.

Another advantage of this embodiment is that the addition of the second wall enables independent control of the acceleration field, the extraction field, and a subsequent field used to further accelerate the ions emerging from the exit diaphragm.

In another embodiment of a particle-optical apparatus according to the invention the distance between the diaphragm wall and the second wall is less than 1 μm, and the diameter of the diaphragms in the diaphragm wall and the entrance diaphragm wall is less than 1 μm.

Such diaphragms can be manufactured in e.g. two foils of conductive material, attached to each other and separated from each other by e.g. photoresist in such a way that a cavity is present at the location where the diaphragms are to be formed, while the cavity is also connected to a gas inlet in one of the foils. This can be done by using e.g. MEMS technology as used in the semiconductor industry. By then drilling through the two foils with a focused ion beam along an axis approximately perpendicular to the foils, to small and well aligned diaphragms are formed. By connecting the gas inlet with a gas reservoir, the space between the diaphragms is then filled with the gas to be ionized.

This makes it possible to use extremely small ionization volumes, making the combination of a high extraction field and a low voltage over the ionization volume possible, resulting in the desired low energy spread of the ion source.

In yet another embodiment of a particle-optical apparatus according to the invention, the extraction field is reversible in direction, whereby, in the case of a first direction of this field, the produced gas ions are extracted, and, in the case of the other direction of this field, electrons are extracted via the exit diaphragm.

Although not necessary, the gas supply can be stopped in this latter case.

By changing the extraction electric field, i.e. by changing a voltage, the source will produce an ion beam or an electron beam, according to choice. The place where the electrons or ions are formed, depending upon this choice, is essentially the same. The advantage of a source according to this embodiment is that, in this manner, an apparatus can be constructed whereby, with just one column, e.g. with electrostatic particle-optical means, it is possible to interchangeably make images, make analyses and/or perform processing with both types of particle.

In still another embodiment of a particle-optical apparatus according to the invention, the electron source is a field emission source or a Schottky source or a Carbon Nano Tube (CNT) electron source.

As known to the skilled artisan these types of electron sources exhibit a high-brightness, enabling the desired high electron density in the ionization volume.

In still yet another embodiment of a particle-optical apparatus according to the invention, the extraction field causes a voltage difference across the ionization volume of less than 10 V, preferably less than 5 V, more preferably less than 1 V.

In addition to a high brightness of the gas ion source, a low energy-spread of the ion beam is also necessary so as to be able to focus the ion beam into a small ion spot, seeing as, otherwise, chromatic aberrations of the imaging particle-optical elements will determine the size of the ion spot. The electric field over the ionization volume causes a voltage difference across the ionization volume. By dimensioning this field such, that the field at the location of the ionization volume causes a voltage difference of, for example, less than 10 V, the energy spread of the ion beam will also be less than 10 eV, so that a ion spot can be formed whose diameter is not determined by chromatic aberrations, but e.g. by the geometric image size of the ion source or by spherical aberrations of the optics.

When using even smaller diameter of the ion spot it might be necessary to limit the voltage over the ionization volume to even lower values, e.g. less than 5 V or more preferential less than 1 V.

In yet another embodiment of a particle-optical apparatus according to the invention, the gas that is to be ionized is a noble gas.

The advantage of the use of a noble gas is that it is easy to obtain noble gases with a high purity, so that there will be few other ions present as impurity in the ion beam. In addition, noble gas atoms generally do not remain behind in the work pieces onto which the ion beam is focused.

In yet another embodiment of a particle-optical apparatus according to the invention, there are means present to maintain the current that is extracted out of the ionization volume approximately constant.

In many applications, it is desired to maintain the ion current constant. The current out of the ionization volume can be varied in many ways, e.g. by varying the current in the electron beam. After all, an increase in the electron density in the ionization volume leads to an increase in the quantity of produced ions. However, a variation in the energy that the electrons possess at the location of the diaphragm wall will also have such an effect, since the probability of ionization is dependent upon the energy of the electrons. A variation of the gas pressure of the admitted gas will also have such an effect.

By now measuring the ion current, or at least a fixed portion hereof, and using this measured value to change a parameter that influences the ion production, it is possible to keep the current out of the ion source constant.

In addition to measurement of the current out of the ionization volume, one can also use measurement of an effect coupled hereto. An example hereof is the light effect that occurs as a result of ionizations, as referred to in said US Patent.

In still another embodiment of a particle-optical apparatus according to the invention the electrons are focused onto the ionization volume.

When focusing the electron current in an electron spot of e.g. 5-500 nm with suitable optics, the electron current density in the spot can be very high. This embodiment is especially attractive when combined with a diameter of the exit diaphragm and the entrance diaphragm of less than 1 μm.

In yet another embodiment of a particle-optical apparatus according to the invention there are means for measuring the electron current impinging on the second wall, said measurement used in stabilizing and/or focusing and/or positioning the electron beam onto the diaphragm in the second wall.

As the ion current varies with varying electron current in the ionization volume, the electron current must be kept stable. To focus the electron beam onto the diaphragm, the optics may comprise a lens and deflectors. With appropriate structures on the second wall, e.g. ring-like structures and/or segments centered round the diaphragm in the second wall, said structures being electrically insulated from the wall and each other, the electron beam can be focused and centered on the diaphragm.

Another advantage of such a structure is that, by scanning the electron beam over such structures, information about e.g. astigmatism of this beam can be detected and corrector for.

In yet another embodiment of a particle-optical apparatus according to the invention, the electron beam is between the electron-emitting surface and the ionization volume a steadily diverging beam and the electron-emitting surface is located at a distance smaller than 300 μm from the exit diaphragm.

This embodiment describes the situation where no focusing optics are used between the electron-emitting surface and the ionization volume.

By placing the electron-emitting surface close to the ionization volume the total current, or a substantial part of the total current, produced by the electron-emitting surface is available in the ionization volume. The acceleration field accelerates the electrons directly to the ionization volume as a diverging beam.

An advantage of the lack of means to focus the electron beam is that this contributes toward greater simplicity and compactness of the gas ion source.

In a further embodiment of a particle-optical apparatus according to the invention, the electron-emitting surface of the electron source is located in the admitted gas.

The ionization volume is now located between the electron-emitting surface and the exit diaphragm, but can also extend into the vacuum space through the exit diaphragm. At the gas side of the diaphragm wall the acceleration field is applied. At the vacuum side of the diaphragm wall, the extraction field is applied, which may or may not extend through the exit diaphragm. The acceleration field and the extraction field have opposite directions (signs), as the acceleration field must accelerate the negatively charged electrons and the extraction field must extract the positively charged ions, both traveling in the same direction. In that portion of the ionization volume in which the second electric field is larger than the first electric field, ions are extracted out of the ionization volume.

It is to be remarked that a consequence of placing the electron-emitting surface close to the ionization volume is that this electron-emitting surface must operate in an environment in which the gas pressure is relatively high. In said US Patent, a gas pressure of the order of magnitude of 0.1 bar is quoted at the location of the ionization volume. In an ion source according to the invention, the gas pressure at the location of the ionization volume, and thereby also at the location of the electron-emitting surface, will be of a comparable order of magnitude as quoted in the said US patent.

Although there is a general impression that high brightness electron sources, such as field emission sources, can only work in high vacuum (pressure lower than, for example, 10-9 mbar)—because otherwise arc-over can occur, which will damage the field emission source—it transpires that such arc-over does not occur if the employed electrical voltages are lower than the minimum in the Paschen curve known to the skilled artisan. The Paschen curve indicates, in the case of a gas between two electrodes, the relationship between, on the one hand, the product of the gas pressure and the distance across which the discharge occurs, and, on the other hand, the arc-over voltage at which the discharge occurs. For all gases, this relationship demonstrates a minimum at a voltage between 200 and 500 Volts. In the case of voltages in a field emission source below this minimum, gas discharges cannot occur.

By suitably choosing the distance between the electron-emitting surface and the diaphragm wall, the acceleration field, which accelerates the electrons to an energy between 50 and 300 Volts, can also serve as the field necessary to emit the electrons out of the field emission source.

An advantage of this embodiment is that a field emission source or a Carbon Nano Tube electron source is bright, has a small emitting surface, and lends itself to miniaturization.

BRIEF DESCRIPTION OF THE DRAWINGS

The invention will be described on the basis of figures, whereby identical reference numerals indicate corresponding elements. To that end.

DETAILED DESCRIPTION OF THE PREFERRED EMBODIMENT

Figure 1:
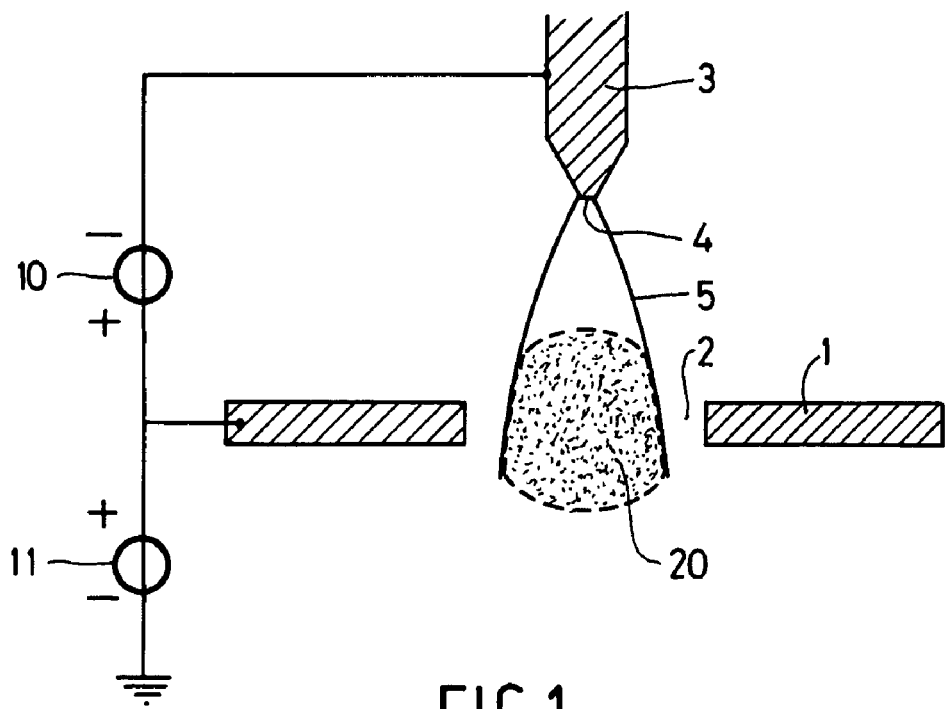
FIG. 1 is a schematic depiction of an ion source according to the invention, whereby the electron-emitting surface is located in the gas.

FIG. 1 shows an ion source according to the invention, whereby the electron-emitting surface 4 is located in the gas. The figure shows a diaphragm wall 1, with an exit diaphragm 2 therein. The size of the exit diaphragm 2 is smaller than 20 µm. Gas is admitted on one side of the diaphragm wall 1 at a pressure of, for example, 0.2 bar. On the other side, a vacuum, or at least a lower gas pressure, is maintained. As a result hereof, gas will flow out of the space where the gas is admitted, through the exit diaphragm 2, into the space where the vacuum is maintained. The diaphragm wall 1 is made of an electrically conductive material, such as a metal, or has conductive surfaces. In the direct vicinity of the exit diaphragm 2, there is located an electron source, such as a field emission source 3 with an electron-emitting surface 4. Between the field emission source 3 and the diaphragm wall 1, a potential difference is generated by a voltage source 10. As a result of this, a first electric field is present between the electron-emitting surface 4 and the diaphragm wall 1. The electrons emitted by the electron-emitting surface 4 are accelerated by this first electric field in the direction of the diaphragm wall 1, in particular towards the exit diaphragm 2. The voltage of the first voltage source 10 is chosen to be between 50 and 300 Volts, so that electrons at the diaphragm wall 1 have an energy of 50 to 300 eV. As a result of this, the electrons in the emerging gas will cause ionizations in an ionization volume 20.

The electron beam 5 increases steadily in diameter in passing from the electron-emitting surface 4 to the exit diaphragm 2. Using simulation programs and/or empirical experiments known per se, it is possible for the skilled artisan to determine the diameter of the electron beam 5 at various distances from the electron-emitting surface 4, and to choose the distance from the electron-emitting surface 4 to the exit diaphragm 2 in such a manner that the diameter of the electron beam 5 at the location of the exit diaphragm 2 is smaller than the diameter of the exit diaphragm 2.

In general, the distance between the electron-emitting surface 4 and the exit diaphragm 2 will have to be less than about ten times the desired diameter of the electron beam 5 at the location of the exit diaphragm 2. So as allow a sizable portion, e.g. about half, of the emission current from the field emission source 3 to fall within the diameter of the exit diaphragm 2, i.e. within a diameter of at most 20 µm, the diameter of the electron beam 5 at the location of the exit diaphragm 2 will thus have to be smaller than about 30 µm, and, thus, the electron-emitting surface 4 of the field emission source 3 will have to be located at a distance of less than 300 µm from the exit diaphragm 2. In this way, the entire, or at least a substantial portion of the, emission current of the field emission source 3 is available within the ionization volume 20.

Using a second voltage source 11, the diaphragm wall 1 is maintained at a voltage with respect to earth, as a result of which, at the vacuum side of the diaphragm wall 1, a second electric field prevails, which is oppositely directed to the first electric field. As a result of this second electric field, the produced ions are extracted out of the ionization volume 20. In addition, the electrons emitted by the field emission source 3 will be retarded by this field. As a result of this, the energy of the electrons will decrease to below about 50 eV, at which energy no, or almost no, more ionizations will occur. As a result, the size of the ionization volume 20 will be limited.

It deserves mention that, although the preceding text describes a diameter of the exit diaphragm 2 of at most 20 µm, and a maximal distance between the electron-emitting surface 4 and the diaphragm wall 1 of 300 µm, it is possible to conceive embodiments—particularly when using a field emission source as electron source 3—in which a much smaller diameter and distance can be applied. When the electric field generated by voltage source 10 is also employed to cause field emission from the field emitter, the distance between the electron-emitting surface 4 and the diaphragm wall 1 will usually have to be chosen to be smaller than 1 µm, and the diameter of the exit diaphragm 2 will also have to be of the same order of magnitude.

Figure 2:
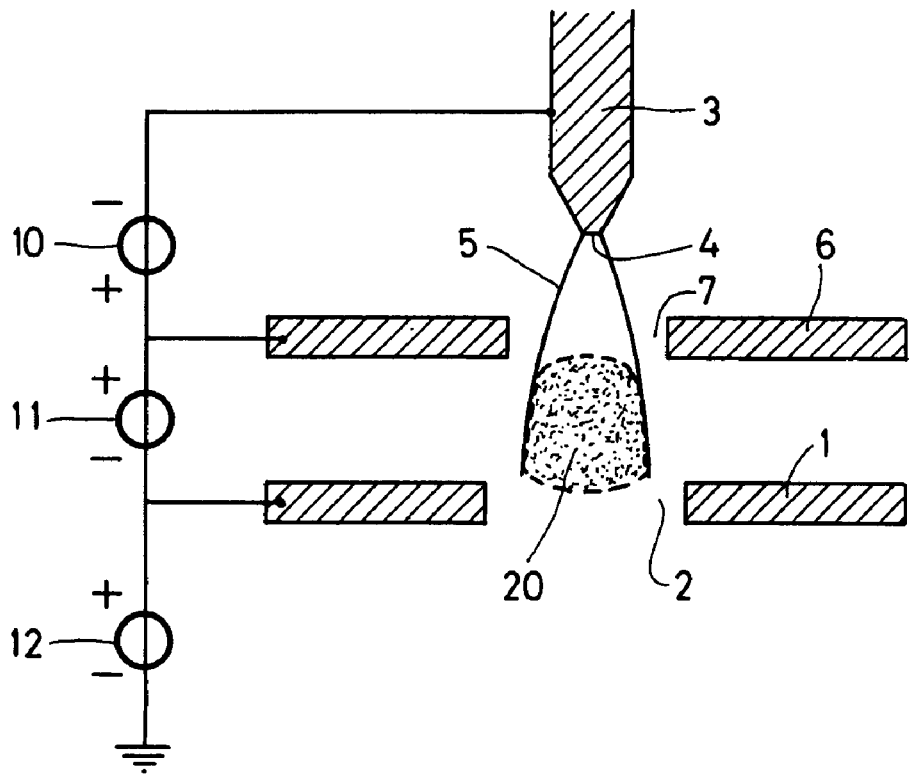
FIG. 2 is a schematic depiction of an ion source according to the invention, whereby the gas is admitted between two walls.

FIG. 2 shows an ion source according to the invention, whereby the gas is admitted between two walls. Between the diaphragm wall 1 and the field emission source 3, a second wall 6 is placed, with a second diaphragm 7 in this second wall 6. The first voltage source 10 causes the first electric field between the field emission source 3 and this second wall 6, as a result of which the electrons coming from the electron-emitting surface 4 are accelerated and reach the ionization region 20 via the second diaphragm 7. In this case also, the diameter of the electron beam 5 will steadily increase in going from the electron-emitting surface 4 to the exit diaphragm 2, as referred to above. The second voltage source 11 causes the second electric field across the ionization volume 20, as a result of which the produced ions are extracted out of the ionization volume 20 and, via the diaphragm 2 in the diaphragm wall 1, reach the vacuum space. A third voltage source 12 accelerates the ions further, so that the ion source can be imaged using particle-optical means known per se.

The gas to be ionized is admitted between the diaphragm wall 1 and the second wall 6. It is now possible to evacuate the space in which the field emission source 3 is placed, so that the field emission source 3 is located in a region with a lower pressure than the pressure at the location of the ionization volume 20.

Figure 3:
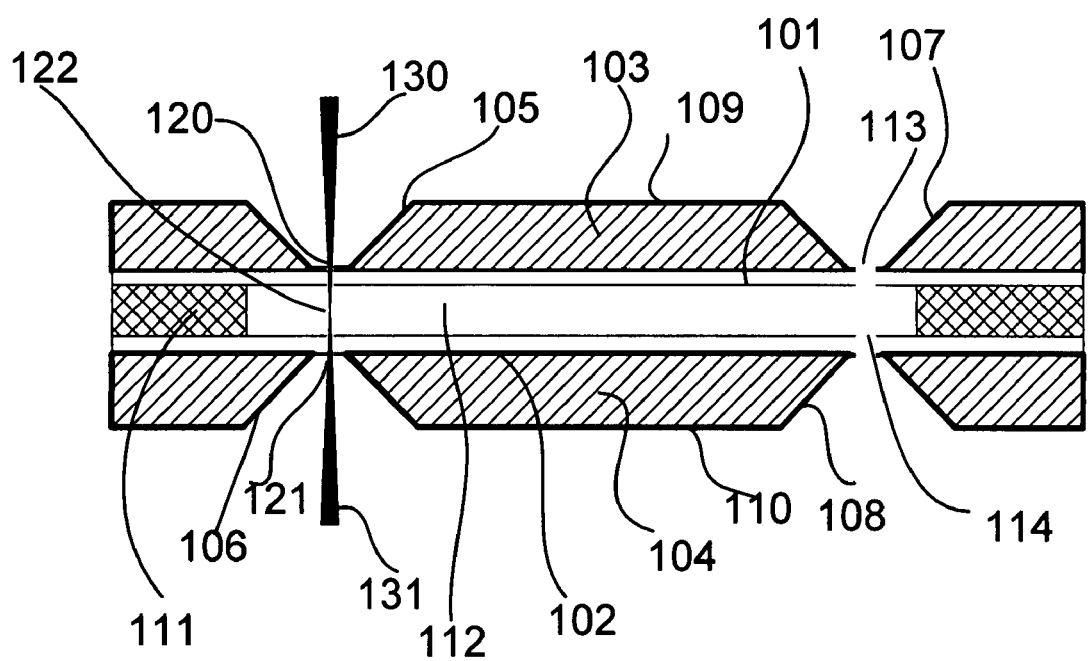
FIG. 3 is a schematic depiction of a MEMS structure for use in an ion source according to the invention, whereby the electrons are focused on the ionization volume.

FIG. 3 schematically shows a MEMS structure for use in an ion source according to the invention, whereby the electrons are focused on the ionization volume.

Two conductive foils 101, 102 are attached to each other and separated from each other by a photoresist layer 111 with a thickness of e.g. 1 µm. The photoresist layer does not fill the complete space between the two foils, but a cavity 112 is left open. The foils 101, 102 are each formed on semiconductor dies cut from a semiconductor wafer, such as Si3N4 dies 103, 104. The material of the foils can be a metal, e.g. Mo. The dies give support to the foil and also enable production of the foil. In the dies recesses 105, 106, 107 and 108 are formed in a lithographic process. Also a conductive layer 109, 110 of e.g. Mo is formed on the Si3N4 dies. In the foils two sets of diaphragms are formed, the entrance diaphragm 120 through which entrance diaphragm a focused electron beam 130 enters the cavity 112, an exit diaphragm 121 through which ions can emerge from the cavity 112, and apertures 113 and 114 through which gas is admitted to the cavity with a gas pressure of e.g. 0.2 bar. The entrance diaphragm and the exit diaphragm both have a small size of e.g. 100 nm, while the apertures through which the gas is admitted may have a larger size, of e.g. 1 µm.

The focused electron beam 130 is produced by a high brightness electron source, such as a field emitter, a Schottky emitter or a CNT electron emitter, known per se. The produced electrons are accelerated and focused on the entrance diaphragm of the MEMS structure with focusing electron optics as known to the skilled artisan in the field of electron optics. Between the entrance diaphragm 120 and the exit diaphragm 121 concurrently a high gas pressure and a high electron density occur, thus forming an ionization volume 122. A small voltage applied between the two foils 101, 102 of e.g. 1 V accelerate the ions formed in the direction of foil 102, where they can leave the cavity 112 through the exit diaphragm 121, to be accelerated further towards particle-optical elements for the manipulation of the ions, known per se. The beam 131 leaving the cavity 112 through the exit aperture 121 consists of both ions and electrons, but as the ions are accelerated towards the particle-optical elements for the manipulation of ions, the electrons are decelerated until they lose their forward momentum and are e.g. reflected back to conductive layer 110.

As the entrance diaphragm and the exit diaphragm have a small size of e.g. 50 nm, the gas pressure outside the cavity 112 as a function of the distance from the foils 101, 102 will drop very rapidly. Also, the amount of gas flowing from the cavity 112 into the volumes outside the dies is very small, so that even when using pumping means with limited capacity, the ionization volume is limited to the region between the foils, as only between the foils the required high gas pressure exists. This also implies that no, or only negligible, charge exchange between gas molecules and ions occurs in the volume where beam 131 enters. Such charge exchange is unwanted as this would lead to an energy broadening of the formed ion beam. Also, the gas pressure at the side where the electron source resides can easily be pumped to a vacuum pressure where these sources can work.

To admit gas to the apertures 113 and 114 the Si3N4 dies 103, 104 are e.g. attached between a holder connected to a gas supply, e.g. by clamping and/or using glue. In this way a bridge between the microscopic cavity and the macroscopic world where the gas resides can be formed.

It is remarked that the Si3N4 dies need not have only two apertures to admit gas.

As will be obvious to the skilled artisan a ring of apertures can be formed around the position where the entrance or exit diaphragm is formed. Also, the apertures need not be round, but can have any shape. It is also possible to have apertures in one die (die 103 or die 104) only.

It is remarked that the use of wafers and photolithographic processes performed on them are known to be used in the manufacturing of miniature particle-optical structures, such as lenses and deflectors. Although not shown, such structures are envisaged to be incorporated in an ion source according to the invention.

Figure 4:
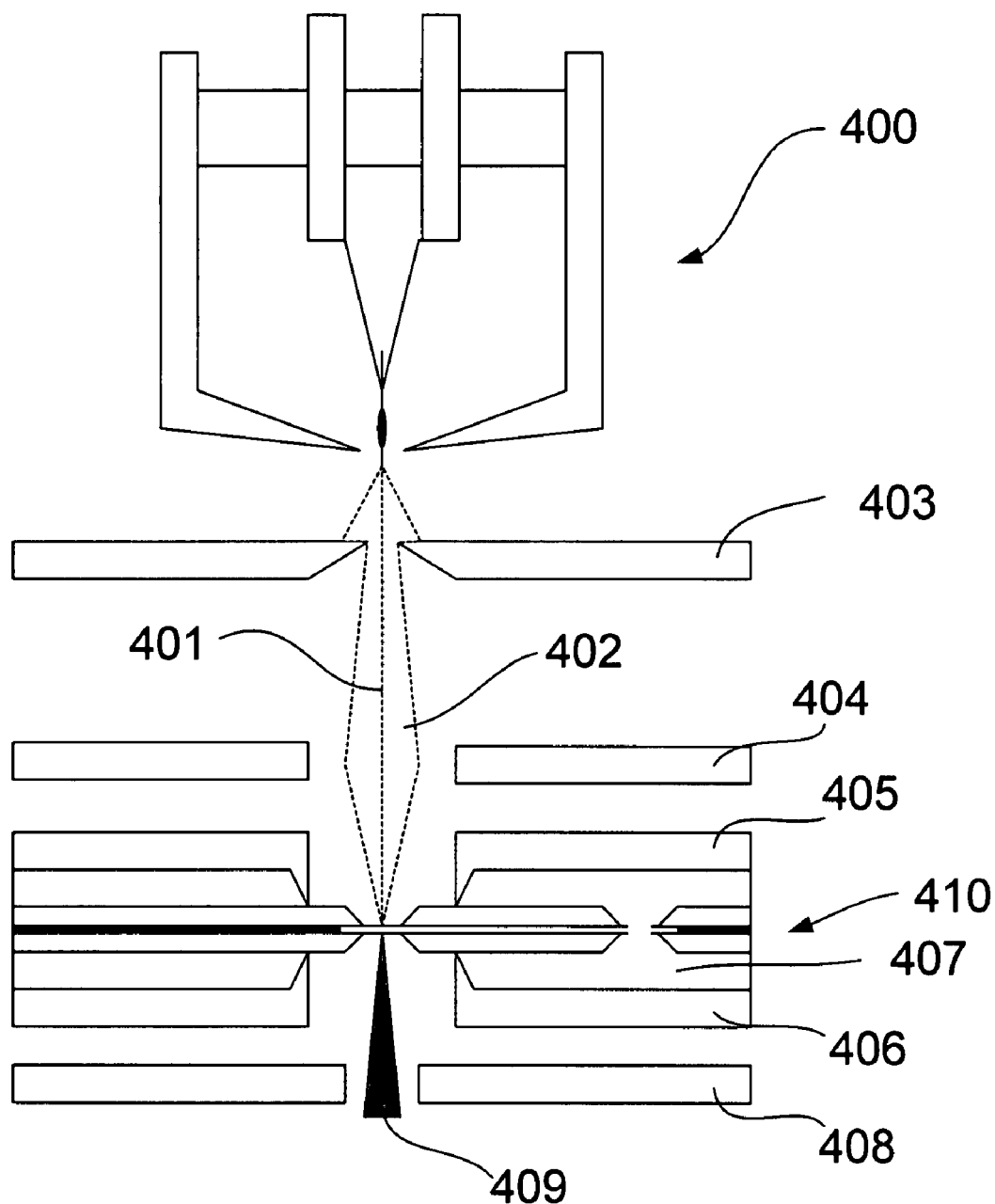
FIG. 4 is a schematic depiction of an ion source according to the invention employing the MEMS structure as depicted in FIG. 3.

FIG. 4 is a schematic depiction of an ion source according to the invention employing the MEMS structure as depicted in FIG. 3.

FIG. 4 depicts a Schottky emitter 400 as can be readily obtained from e.g. FEI Company, emitting a beam of electrons 402 along an optical axis 401. The electrons are extracted from the Schottky emitter by an electric field caused by a voltage difference between the tip of the emitter 400 and the extractor electrode 403. Seen from the electron source the extractor 403 is followed by a combined lens/deflector made by a segmented plate electrode 404, where a voltage difference between the segments causes a deflector action and a voltage difference of the combined segments with respect to the extractor electrode 403 and electrode 405 causes a lens action.

It is remarked that this segmented electrode 404 can also be used as a stigmator.

Electrode 405 is also connected to the side of the MEMS structure 410 (the MEMS structure depicted in FIG. 3) where the electrons enter said MEMS structure. The other side of the MEMS structure is connected to electrode 406. A voltage of e.g. 1 V between electrodes 405 and 406, and thus between the two foils of the MEMS structure, causes the electric field over the ionization volume. The connection of electrodes 405 and 406 form a vacuum seal with the MEMS structure 410, and gas is entered via these electrodes to the cavity in the MEMS structure. Electrode 408 extracts the ions formed in the MEMS structure 410, resulting in a beam of ions 409 emanating from the MEMS structure.

Figure 5:
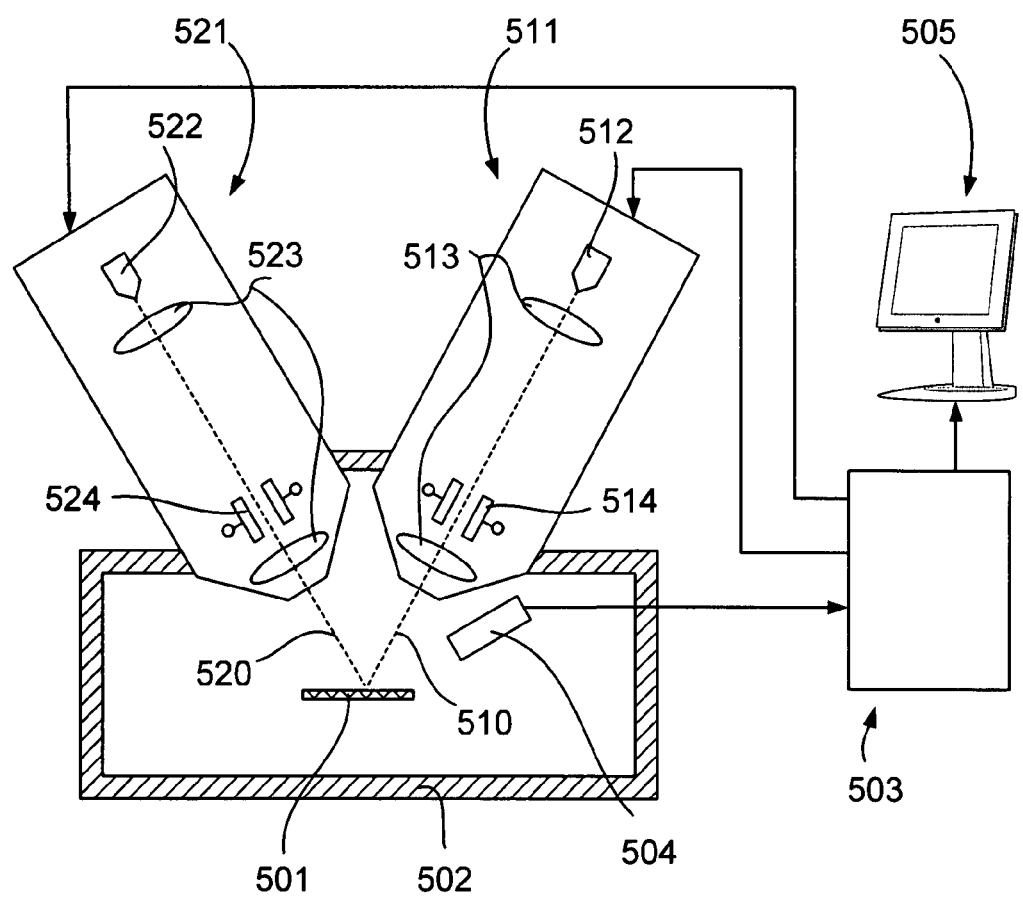
FIG. 5 is a schematic depiction of a particle-optical apparatus according to the invention.

FIG. 5 is a schematic depiction of a particle-optical apparatus according to the invention.

Depicted is a so-called dual beam apparatus, where a beam of ions 510 and a beam of electrons 520 are simultaneously focused on a workpiece such as a semiconductor wafer 501, placed in a vacuum chamber 502.

It is remarked that such apparatus are already known, but the ion species are normally limited to ions produced by Liquid Metal Ion Sources, such as gallium.

The ion beam 510 is produced by an ion column 511, which comprises an ion source 512 according to the invention, focusing means such as electrostatic lenses 513 for focusing the ion beam 510 onto the wafer 501 and a deflector 514 for deflecting and rastering the ion beam 510 over the workpiece 501. The ions produced, e.g. a heavy noble gas like xenon, can be used to modify the wafer.

The electron beam 520 is produced by an electron column 521, known per se, comprising an electron source 522, electrostatic or magnetic lenses 523 and a deflector 524.

Both the ion column 511 and the electron column 521 are controlled by a control unit 503.

Further the apparatus may comprise a detector 504 for detecting e.g. back-scattered electrons, said electrons resulting from the bombardment of the wafer with electrons being scanned over the wafer, thereby obtaining spatial information of the wafer 501. By feeding this information to the control unit 503 this control unit can generate an image on a screen 505 to be viewed by the user of the apparatus.

The gas used in the ion source 512 can be fed to the ion source from the outside of the ion column 511, but as the amount of gas escaping the exit and the entrance diaphragm in the ion source is very small (due to the small diameter of the diaphragms), it is also possible to include a gas canister in the ion column.

It will be clear that numerous modifications and changes may be applied to the embodiments described hereinbefore, without departing from the scope of the invention.

We claim as follows:

1. A particle-optical apparatus equipped with a gas ion source, which gas ion source comprises:
   a diaphragm wall in which an exit diaphragm with a diameter of at most 20 µm is fitted,
   an electron source with an electron-emitting surface for generating an electron beam,
   an opening for admitting a gas at a first side of the diaphragm wall,
   a vacuum source for causing a vacuum, in the form of a lower gas pressure, at the other side of the diaphragm wall;
   an acceleration electrode for producing an acceleration field accelerating the electron beam to an energy whereby the electrons of this electron beam ionize the gas in an ionization volume, and
   an extraction electrode for producing an extraction field extracting the produced gas ions from the ionization volume,
   characterized in that
   the electron-emitting surface is located at the gas side of the diaphragm wall, and
   the diameter of the electron beam at the location of the ionization volume is less than 30 µm.

2. A particle-optical apparatus according to claim 1, wherein a second wall is located between the electron-emitting surface and the diaphragm wall, in which second wall an entrance diaphragm is fitted, through which entrance diaphragm the accelerated electrons reach the gas that is to be ionized.

3. A particle-optical apparatus according to claim 2, wherein the distance between the diaphragm wall and the second wall is less than 1 µm, and wherein the diameter of the diaphragms in the diaphragm wall and second wall is less than 1 µm.

4. A particle-optical apparatus according to claim 1, wherein the extraction field is reversible in direction, whereby, in the case of a first direction of this field, the produced gas ions are extracted, and, in the case of the other direction of this field, electrons are extracted via the exit diaphragm.

5. A particle-optical apparatus according to claim 1, wherein the electron source is a field emission source or a Schottky source or a carbon nanotube electron source.

6. A particle-optical apparatus according to claim 1, wherein the acceleration field and the extraction field together cause a voltage difference across the ionization volume of less than 10 V.

7. A particle-optical apparatus according to claim 1, wherein the admitted gas is a noble gas.

8. A particle-optical apparatus according to claim 1, wherein the extraction electrode extracts an approximately constant current out of the ionization volume.

9. A particle-optical apparatus according to claim 1, wherein the electrons are focused onto the ionization volume.

10. A particle-optical apparatus according to claim 2, wherein there are provided a current detector for measuring the electron current impinging on the second wall, said measurement used for at least one of stabilizing, focusing, and positioning the electron beam onto the entrance diaphragm in the second wall.

11. A particle-optical apparatus according to claim 1, wherein the electron beam diverges between the electron-emitting surface and the ionization volume and the electron-emitting surface is located at a distance smaller than 300 µm from the exit diaphragm.

12. A particle-optical apparatus according to claim 11, wherein the electron-emitting surface is located in the admitted gas.

13. A gas ion source for use in a particle-optical apparatus according to claim 1.

14. A gas ion source comprises:
   a diaphragm wall having an exit diaphragm,
   a gas region containing a gas at a first side of the diaphragm wall,
   a vacuum region having a lower pressure than the gas region and positioned on the opposite side of the diaphragm wall;
   an electron source with an electron-emitting surface positioned on the first side of the diaphragm wall;
   an acceleration electrode for accelerating a beam of electrons from the electron source to an energy sufficient to ionize gas in an ionization volume, and an extraction electrode for extracting gas ions from the ionization volume.

15. A gas ion source according to claim 14, wherein the electron source emits an electron beam having a diameter at the location of the ionization volume of less than 30 µm.

16. A gas ion source according to claim 14, further comprising a second wall positioned between the electron-emitting surface and the diaphragm wall, the second wall including an entrance diaphragm through electrons from the electron-emitting surface pass to reach the gas that is to be ionized.

17. A gas ion source according to claim 16, wherein the distance between the diaphragm wall and the second wall is less than 1 µm.

18. A gas ion source according to claim 17 wherein the diameter of the diaphragm in the diaphragm wall and the diameter of the second wall are less than about 1 µm.

19. A gas ion source according to claim 14, wherein the electron-emitting surface is located at a distance of less than 300 µm from the exit diaphragm.

20. A particle-optical apparatus comprising:
a gas ion source in accordance with claim 14;
a lens for focusing a beam of the extracted ions onto a work piece; and
a deflector for deflecting the beam to impact different locations on the work piece surface.

21. A method of producing an ion beam, comprising:
providing a first region at a first gas pressure, a second region at a second gas pressure lower than the first gas pressure, and an aperture in a diaphragm wall between the regions;
directing a beam of electrons toward the aperture from the same side of the aperture as the first region to ionize gas near the aperture;
extracting ions from the ionized gas around the aperture; and
focusing the extracted ions into a beam directed toward a work piece.

22. The method of claim 21 wherein providing an aperture between the regions includes providing an aperture having a diameter of less than about 20 µm and wherein directing a beam of electrons to ionize gas near the aperture includes directing a beam of electrons having a diameter of less than 30 µm at the aperture.

23. The method of claim 21 further comprising providing a second wall between the electron-emitting surface and the diaphragm wall, the second wall including an entrance diaphragm and wherein directing a beam of electrons includes directing a beam of electrons through the entrance diaphragm toward the gas that is to be ionized.

24. The method of claim 21 further comprising providing a second wall between the electron-emitting surface includes providing a second wall at a distance of less than 1 µm from the diaphragm wall.

25. The method of claim 24 wherein the diameter of the diaphragm in the diaphragm wall and the diameter of the second wall are less than about 1 µm.

26. The method of claim 21 wherein, wherein directing an electron beam includes directing an electron beam a distance less than 300 µm from an electron beam source to the exit diaphragm.

27. The gas ion source of claim 14 wherein the electron source comprises a high brightness electron source.

28. The gas ion source of claim 27 wherein the electron source comprises a field emitter, a Schottky emitter, or a carbon nanotube.

29. The method of claim 21 in which directing a beam of electrons toward the aperture includes directing a beam of electrons from an electron source comprising a field emitter, a Schottky emitter, or a carbon nanotube.

* * * * *

UNITED STATES PATENT AND TRADEMARK OFFICE
CERTIFICATE OF CORRECTION

PATENT NO. : 7,772,564 B2  
APPLICATION NO. : 11/709303  
DATED : August 10, 2010  
INVENTOR(S) : Pieter Kruit and Vipin Nagnath Tondare Page 1 of 2

It is certified that error appears in the above-identified patent and that said Letters Patent is hereby corrected as shown below:

Title page, item (73) Assignee – Please change "Fei Company" to read "FEI Company";

Column 1, Line 41 – Please change "located vacuum" to read "located a vacuum";

Column 3, Line 21 – Please change "factors two" to read "factors, two";

Column 3, Line 45 – Please change "Experiments learn" to read "Experiments teach";

Column 4, Line 31 – Please change "a entrance" to read "an entrance";

Column 4, Line 57 – Please change "invention the" to read "invention, the";

Column 5, Line 2 – Please change "to small" to read "two small";

Column 6, Line 42 – Please change "round" to read "around";

Column 6, Line 50 – Please change "beam is" to read "beam that is";

Column 6, Line 51 – Please change "volume a" to read "volume is a";

Column 6, Line 52 – Please change "beam and" to read "beam, and";

Column 10, Line 39 – Please change "artisan a" to read "artisan, a";

Column 12, Line 41 – Please change "are provided" to read "is provided";

Column 13, Line 9 – Please change "through electrons" to read "through which electrons";

Signed and Sealed this  
Nineteenth Day of April, 2011

David J. Kappos  
*Director of the United States Patent and Trademark Office*

CERTIFICATE OF CORRECTION (continued)
U.S. Pat. No. 7,772,564 B2

Column 14, Line 16 – Please change "between the electron-emitting surface includes" to read "between the electron-emitting surface and the diaphragm wall includes"